US012338529B2

(12) United States Patent
Morita et al.

(10) Patent No.: US 12,338,529 B2
(45) Date of Patent: Jun. 24, 2025

(54) SUBSTRATE PROCESSING APPARATUS, PROCESS VESSEL, METHOD OF MANUFACTURING SEMICONDUCTOR DEVICE AND NON-TRANSITORY TANGIBLE MEDIUM

(71) Applicant: Kokusai Electric Corporation, Tokyo (JP)

(72) Inventors: Shinya Morita, Toyama (JP); Seiyo Nakashima, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 408 days.

(21) Appl. No.: 17/885,636

(22) Filed: Aug. 11, 2022

(65) Prior Publication Data

US 2023/0096080 A1 Mar. 30, 2023

(30) Foreign Application Priority Data

Sep. 24, 2021 (JP) .................. 2021-156062

(51) Int. Cl.
*C23C 16/40* (2006.01)
*C23C 16/455* (2006.01)
(52) U.S. Cl.
CPC .............. *C23C 16/45563* (2013.01)
(58) Field of Classification Search
CPC . C23C 16/54; C23C 16/45551; C23C 16/545; C23C 16/4412; C23C 14/568;

(Continued)

(56) References Cited

U.S. PATENT DOCUMENTS 8,070,880 B2\* 12/2011 Marubayashi .... H01L 21/67248
156/345.31
8,398,771 B2\* 3/2013 Nakada ................. C23C 16/452
118/724

(Continued)

FOREIGN PATENT DOCUMENTS

JP 09-097767 A 4/1997
JP 2002-299273 A 10/2002

(Continued)

*Primary Examiner* — Rudy Zervigon
(74) *Attorney, Agent, or Firm* — Volpe Koenig

(57) ABSTRACT

A technique for connecting a nozzle to a reaction tube while preventing the nozzle from collapsing includes a substrate processing apparatus including: a gas introduction structure comprising a non-metallic material penetrating a side wall of a process vessel and integrated with the side wall as a single structure, wherein a front end thereof protrudes into the process vessel; a nozzle made of a non-metallic material and including: a first straight portion inserted into the gas introduction structure and fluidically communicating with the gas introduction structure; and a second straight portion fluidically communicating with the first straight portion and extending along an inner wall of the process vessel; and a fixing block provided at an inner side of the process vessel and above the gas introduction structure, wherein the fixing block has a groove where the nozzle can be moved in a radial direction of the process vessel.

16 Claims, 7 Drawing Sheets

(58) Field of Classification Search
CPC .......... C23C 16/4401; C23C 16/45563; H01L 21/6719; H01L 21/67196; H01L 21/67201; H01L 21/67173; H01L 21/67184; H01L 21/6776; H01L 21/67161; H01L 21/67155; H01L 21/67017; H01L 21/67069; H01L 21/67748; H01L 21/67751; H01L 21/67745; H01L 21/67115; H01L 21/67248; H01L 21/67303
USPC ................ 118/719, 715; 156/345.31, 345.32
See application file for complete search history.

(56) References Cited

U.S. PATENT DOCUMENTS

| | | | |
|---|---|---|---|
| 11,124,872 B2* | 9/2021 | Ohno | H01L 21/02271 |
| 2009/0116936 A1* | 5/2009 | Marubayashi | H01L 21/67248 |
| | | | 414/148 |
| 2010/0212593 A1* | 8/2010 | Takebayashi | H01L 21/67109 |
| | | | 118/725 |
| 2021/0348275 A1 | 11/2021 | Kurata et al. | |

FOREIGN PATENT DOCUMENTS

| | | |
|---|---|---|
| JP | 2010-093131 A | 4/2010 |
| JP | 2011-114069 A | 6/2011 |
| JP | 2013-187459 A | 9/2013 |
| JP | 2017-157594 A | 9/2017 |
| WO | 2018/179157 A1 | 10/2018 |
| WO | 2020/189176 A1 | 9/2020 |

\* cited by examiner

SUBSTRATE PROCESSING APPARATUS, PROCESS VESSEL, METHOD OF MANUFACTURING SEMICONDUCTOR DEVICE AND NON-TRANSITORY TANGIBLE MEDIUM

CROSS-REFERENCE TO RELATED PATENT APPLICATION

This non-provisional U.S. patent application claims priority under 35 U.S.C. § 119 of Japanese Patent Application No. 2021-156062, filed on Sep. 24, 2021, in the Japanese Patent Office, the entire contents of which are hereby incorporated by reference.

BACKGROUND

1. Field

The present disclosure relates to a substrate processing apparatus, a process vessel, a method of manufacturing a semiconductor device and a non-transitory tangible medium.

2. Related Art

As a substrate processing apparatus used in a method of manufacturing a semiconductor device, a substrate processing apparatus provided with a nozzle through which a process gas is supplied to a substrate in a process chamber may be used.

The nozzle may be replaced with a new nozzle when the nozzle deteriorates, or various nozzles may be evaluated by replacing the nozzle with another nozzle. In such a case, it is preferable to use a technique capable of connecting and fixing a nozzle made of quartz to a reaction tube made of quartz while preventing the nozzle from collapsing.

SUMMARY

According to the present disclosure, there is provided a technique capable of connecting and fixing a nozzle to a reaction tube while preventing the nozzle from collapsing.

Other objects and novel features of the technique of the present disclosure will become apparent from the descriptions of the present specification and the accompanying drawings.

The following is a brief overview of a representative one of the techniques of the present disclosure.

According to one aspect of the technique of the present disclosure, there is provided a substrate processing method including: a gas introduction structure made of a non-metallic material, penetrating a side wall of a process vessel and integrated with the side wall as a single structure, wherein a front end thereof protrudes into the process vessel; a nozzle made of a non-metallic material and including: a first straight portion inserted into the gas introduction structure and fluidically communicating with the gas introduction structure; and a second straight portion fluidically communicating with the first straight portion and extending along an inner wall of the process vessel; and a fixing block provided at an inner side of the side wall of the process vessel and above the gas introduction structure, wherein the fixing block is provided with a groove in which the nozzle is capable of being moved in a radial direction of the process vessel.

DETAILED DESCRIPTION

Embodiments

Figure 1:
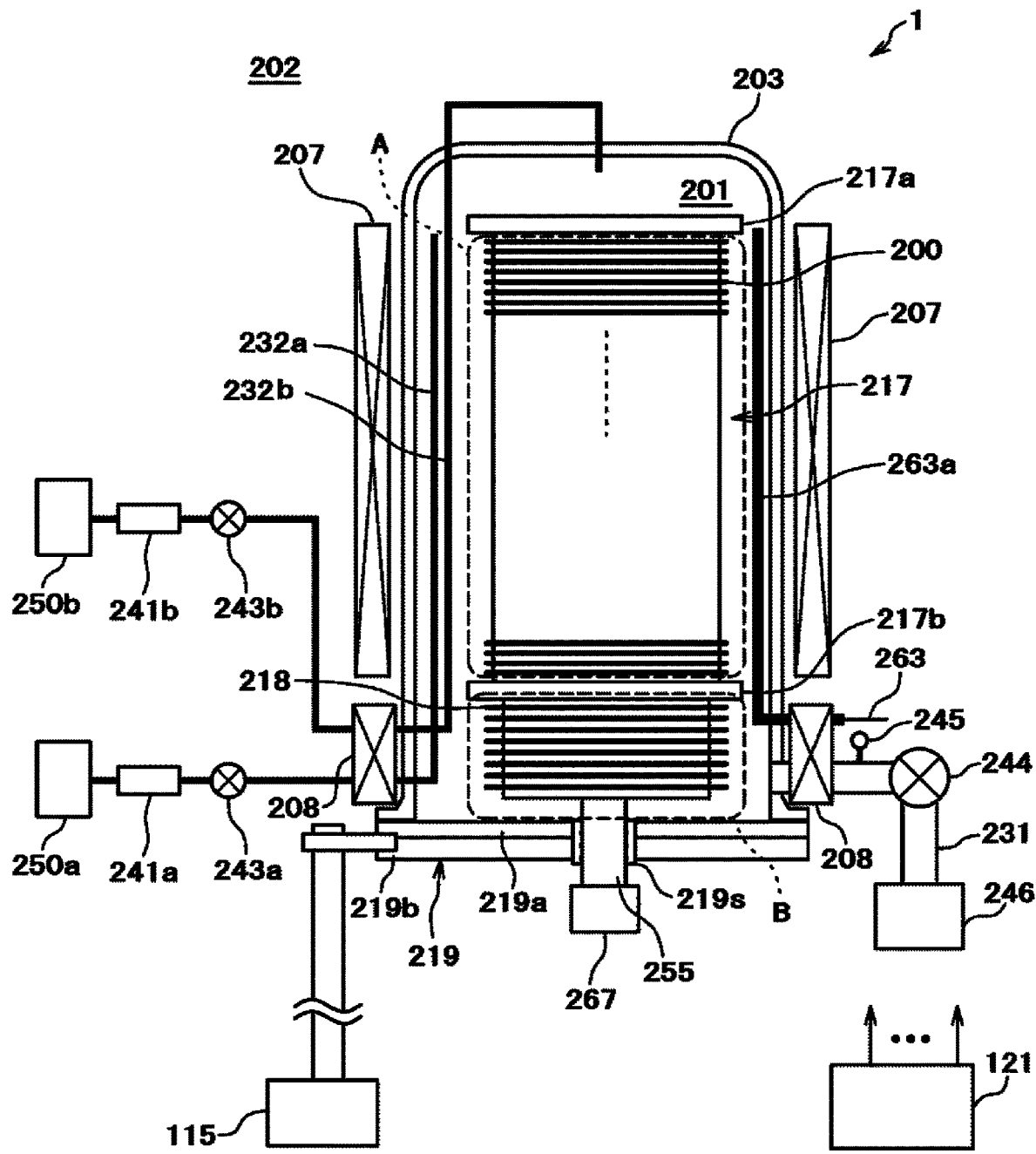
FIG. 1 is a diagram schematically illustrating a vertical cross-section of a vertical type process furnace of a substrate processing apparatus preferably used in one or more embodiments of the present disclosure.

Hereinafter, one or more embodiments (also simply referred to as "embodiments") according to the technique of the present disclosure will be described with reference to the drawings. Like reference numerals represent like components in the drawings, and redundant descriptions related thereto may be omitted. In the drawings, for the sake of clarity of the descriptions, features may be schematically illustrated as compared with actual features. However, the drawings are merely examples of the embodiments, and the embodiments according to the technique of the present disclosure are not limited thereto.

(1) Exemplary Configuration of Substrate Processing Apparatus

FIG. 1 is a diagram schematically illustrating a vertical cross-section of a vertical type process furnace 202 of a substrate processing apparatus 1 preferably used in the embodiments of the present disclosure. As shown in FIG. 1, the substrate processing apparatus 1 includes the vertical type process furnace 202. The process furnace 202 is provided with a reaction tube 203 serving as a process vessel. The reaction tube 203 is made of a heat and corrosion resistant material such as quartz ($SiO_2$) and silicon carbide (SiC). The reaction tube 203 is configured as a cylindrical structure provided with a furnace opening (which is an opening) at a lower end thereof. A process chamber 201 is provided in a hollow cylindrical portion of the reaction tube 203. The process chamber 201 is configured such that a wafer accommodating region A (hereinafter, also referred to as a "region A") serving as a first region in which a plurality of wafers including a wafer 200 serving as a substrate are accommodated and a furnace opening peripheral region B (hereinafter, also referred to as a "region B") serving as a second region provided below the region A in a vertical direction are provided in the process chamber 201. Hereinafter, the plurality of wafers including the wafer 200 may also be simply referred to as "wafers 200".

A seal cap 219 serving as a lid capable of airtightly sealing (or closing) a lower end opening of the reaction tube 203 is provided below the reaction tube 203. A rotator 267 is provided below the seal cap 219. The seal cap 219 is of a disk shape. The seal cap 219 is configured by stacking an upper surface base structure 219a constituting an upper surface portion of the seal cap 219 and a lower surface base structure 219b constituting a lower surface portion of the seal cap 219. For example, the upper surface base structure 219a is made of a non-metallic material such as quartz, and a thickness of the upper surface base structure 219a is set to be about 10 mm to 20 mm. For example, the lower surface base structure 219b is made of a metal material such as stainless steel (SUS). A rotating shaft 255 of the rotator 267 is connected to a boat 217 through the seal cap 219. As the rotator 267 rotates the boat 217, the wafers 200 accommodated in the boat 217 are rotated. A bearing structure 219s of the rotating shaft 255, which is provided on the rotating shaft 255, is configured as a fluid seal such as a magnetic seal. The seal cap 219 is configured to be elevated or lowered in the vertical direction by a boat elevator 115 provided below the reaction tube 203. The boat elevator 115 serves as a transfer structure (which is a transfer device) capable of transferring (or loading) the boat 217 and the wafers 200 accommodated in the boat 217 into the process chamber 201 and transferring (or unloading) the boat 217 and the wafers 200 accommodated in the boat 217 out of the process chamber 201 by elevating or lowering the seal cap 219.

The boat 217 serving as a substrate support (or a substrate retainer) is configured such that the wafers 200 (for example, 25 wafers to 200 wafers) are accommodated (or supported) in the vertical direction in the boat 217 while the wafers 200 are horizontally oriented with their centers aligned with one another with a predetermined interval therebetween in a multistage manner. For example, the boat 217 is made of a heat resistant material such as quartz and SiC, and is provided with a top plate 217a and a bottom plate 217b at a top and a bottom thereof, respectively. For example, a plurality of heat insulation plates 218 made of a heat resistant material such as quartz and SiC are horizontally oriented and provided below the boat 217 to be supported in a multistage manner. The plurality of heat insulation plates 218 are configured to suppress a heat conduction between the region A and the region B. The plurality of heat insulation plates 218 may be considered as a part of components constituting the boat 217.

A heater 207 serving as a first heating structure and a heater 208 serving as a second heating structure are provided outside the reaction tube 203. The electric power is supplied to the heaters 207 and 208 from a heater power supply 210 (see FIG. 6).

The heater 207 is installed vertically so as to surround at least the region A. The heater 207 is controlled such that the wafers 200 accommodated in the region A are capable of being heated to a predetermined temperature in a substrate processing described later.

The heater 208 is provided below the heater 207 in the vertical direction so as to surround at least a part of the region B. The heater 208 is constituted by a plurality of heater structures arranged (divided) in an outer peripheral direction of the reaction tube 203. The heater 208 is controlled such that each temperature of structures (in particular, a temperature of a side wall in the vicinity of the furnace opening of the reaction tube 203 and a temperature of a piping structure in the vicinity of the furnace opening of the reaction tube 203) is capable of being maintained at a predetermined temperature in the substrate processing described later. Hereinafter, the side wall in the vicinity of the furnace opening of the reaction tube 203 may also be simply referred to as "a side wall of the furnace opening".

A temperature sensor protection pipe 263a configured to penetrate a side wall of the reaction tube 203 from an outside to an inside of the side wall of the reaction tube 203 and to extend along an inner wall of the reaction tube 203 is provided in the process chamber 201. A temperature sensor 263 serving as a temperature detector is provided in the temperature sensor protection pipe 263a by inserting temperature sensor 263 into the temperature sensor protection pipe 263a from the outside of the reaction tube 203. It is possible to adjust an output of the heater 207 based on temperature information detected by the temperature sensor 263. The temperature sensor 263 is constituted mainly by a thermocouple. Further, a plurality of temperature sensors including the temperature sensor 263 and a plurality of temperature sensor protection pipes including the temperature sensor protection pipe 263a may be provided.

A first gas supply pipe 232a and a second gas supply pipe 232b are connected to the side wall of the reaction tube 203. Gases described later are supplied into the process chamber 201 through the first gas supply pipe 232a and the second gas supply pipe 232b, respectively. For example, each of the gas supply pipe 232a and the gas supply pipe 232b is configured as a non-metal gas supply pipe made of a heat resistant material such as quartz ($SiO_2$) or silicon carbide (SiC), and is configured to penetrate the side wall in the vicinity of the furnace opening of the reaction tube 203 (that is, the side wall around the region B) from the outside to the inside of the side wall of the reaction tube 203 and to extend upward along the inner wall of the reaction tube 203. The second gas supply pipe 232b further extends upward outside the reaction tube 203 by protruding from a ceiling portion of the reaction tube 203, and then is connected to an inside of the reaction tube 203 in the vicinity of a center of the ceiling portion of the reaction tube 203. A front end (tip) or a side surface portion of the first gas supply pipe 232a and a front end (tip) of the second gas supply pipe 232b are open so as to provide a gas supply hole (which is a discharge hole) for each of the first gas supply pipe 232a and the second gas supply pipe 232b. The first gas supply pipe 232a is configured such that a vaporized gas of a first oxidizing agent is supplied into the process chamber 201 through the first gas supply pipe 232a, and the second gas supply pipe 232b is configured such that a gas of a second oxidizing agent is supplied into the process chamber 201 through the second gas supply pipe 232b.

A gas generator 250a, a mass flow controller (MFC) 241a serving as a flow rate controller (flow rate controlling structure) and a valve 243a serving as an opening/closing valve are sequentially provided at the first gas supply pipe 232a in this order from an upstream side to a downstream side of the first gas supply pipe 232a along a gas flow direction. The gas generator 250a is connected to pipes (not shown) such as a liquid supply pipe through which the first oxidizing agent serving as a source material in a liquid state is supplied and a carrier gas supply pipe through which a carrier gas used to vaporize the liquid is supplied. The first oxidizing agent possesses a property of being easily liquefied. The first oxidizing agent alone or the first oxidizing agent mixed with other substances in the process vessel possesses a property of attacking a metal, for example, destroying and rusting a substance such as a passivation layer.

A gas supply source 250b, a mass flow controller (MFC) 241b serving as a flow rate controller (flow rate controlling structure) and a valve 243b serving as an opening/closing valve are sequentially provided at the second gas supply pipe 232b in this order from an upstream side to a downstream side of the second gas supply pipe 232b along the gas flow direction. A gas supply pipe (not shown) through which the second oxidizing agent serving as a gas source is supplied and a carrier gas supply pipe (not shown) through which the carrier gas is supplied may serve as the gas supply source 250b. When the second oxidizing agent is a source material in a liquid state, the gas supply source 250b serves as a gas generator.

For example, at least one selected from the group consisting of hydrogen peroxide, water and ozone may be used as the first oxidizing agent. For example, oxygen ($O_2$) may be used as the second oxidizing agent.

The present embodiments will be described by way of an example in which hydrogen peroxide solution is used as the first oxidizing agent. The hydrogen peroxide solution refers to an aqueous solution obtained by dissolving hydrogen peroxide ($H_2O_2$) which is a liquid at a normal temperature in water ($H_2O$) serving as a solvent. For example, the gas generator 250a heats the hydrogen peroxide solution to a predetermined temperature (which is a vaporization temperature) to convert it into a gaseous or mist state so as to generate the vaporized gas of the first oxidizing agent. The vaporized gas contains the $H_2O_2$ in a gaseous state or in a mist state and water vapor ($H_2O$ gas) with predetermined concentrations, respectively. The $H_2O_2$ contained in the vaporized gas is a kind of active oxygen, is unstable and easily releases oxygen (O), generates an OH radical, and acts as an oxidizing agent (oxygen source) with a very strong oxidizing power.

A vaporized gas supplier (which is a vaporized gas supply structure or a vaporized gas supply system) is constituted mainly by the first gas supply pipe 232a, the MFC 241a and the valve 243a. A gas supplier (which is a gas supply structure or a gas supply system) is constituted mainly by the second gas supply pipe 232b, the MFC 241b and the valve 243b.

An exhaust pipe 231 through which an inner atmosphere of the process chamber 201 is exhausted is connected to the side wall in the vicinity of the furnace opening (around the furnace opening) of the reaction tube 203. A vacuum pump 246 serving as a vacuum exhaust apparatus is connected to the exhaust pipe 231 through a pressure sensor 245 and an APC (Automatic Pressure Controller) valve 244. The pressure sensor 245 serves as a pressure detector configured to detect an inner pressure of the process chamber 201, and the APC valve 244 serves as a pressure regulator. With the vacuum pump 246 in operation, the APC valve 244 may be opened or closed to vacuum-exhaust the process chamber 201 or stop the vacuum exhaust. With the vacuum pump 246 in operation, the inner pressure of the process chamber 201 may be adjusted by adjusting an opening degree of the APC valve 244 based on pressure information detected by the pressure sensor 245. An exhauster (which is an exhaust structure or an exhaust system) is constituted mainly by the exhaust pipe 231, the APC valve 244 and the pressure sensor 245. The exhauster may further include the vacuum pump 246.

Figure 2:
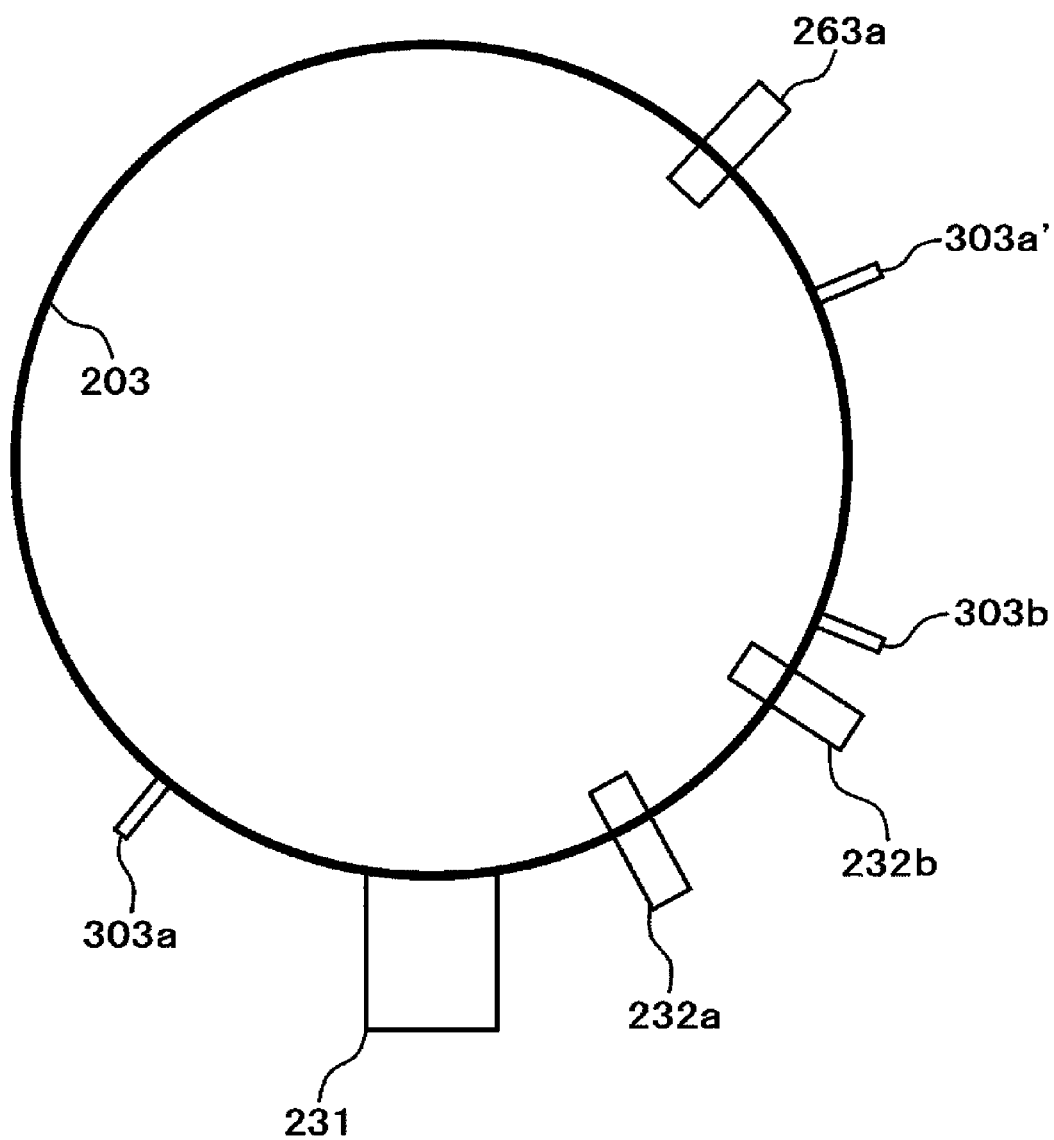
FIG. 2 is a diagram schematically illustrating a horizontal cross-section of a structure around a furnace opening of a reaction tube of the substrate processing apparatus preferably used in the embodiments of the present disclosure.

FIG. 2 is a diagram schematically illustrating a horizontal cross-section of a structure around the furnace opening of the reaction tube 203 of the substrate processing apparatus 1 preferably used in the embodiments of the present disclosure. As shown in FIG. 2, the piping structure such as the gas supply pipes 232a and 232b, the temperature sensor protection pipe 263a and the exhaust pipe 231 is provided on the side wall of the furnace opening of the reaction tube 203. Side wall temperature sensors 303a, 303a' and 303b configured to measure a temperature of an outer peripheral surface of the side wall of the furnace opening may be further provided on the side wall of the furnace opening of the reaction tube 203.

Figure 3:
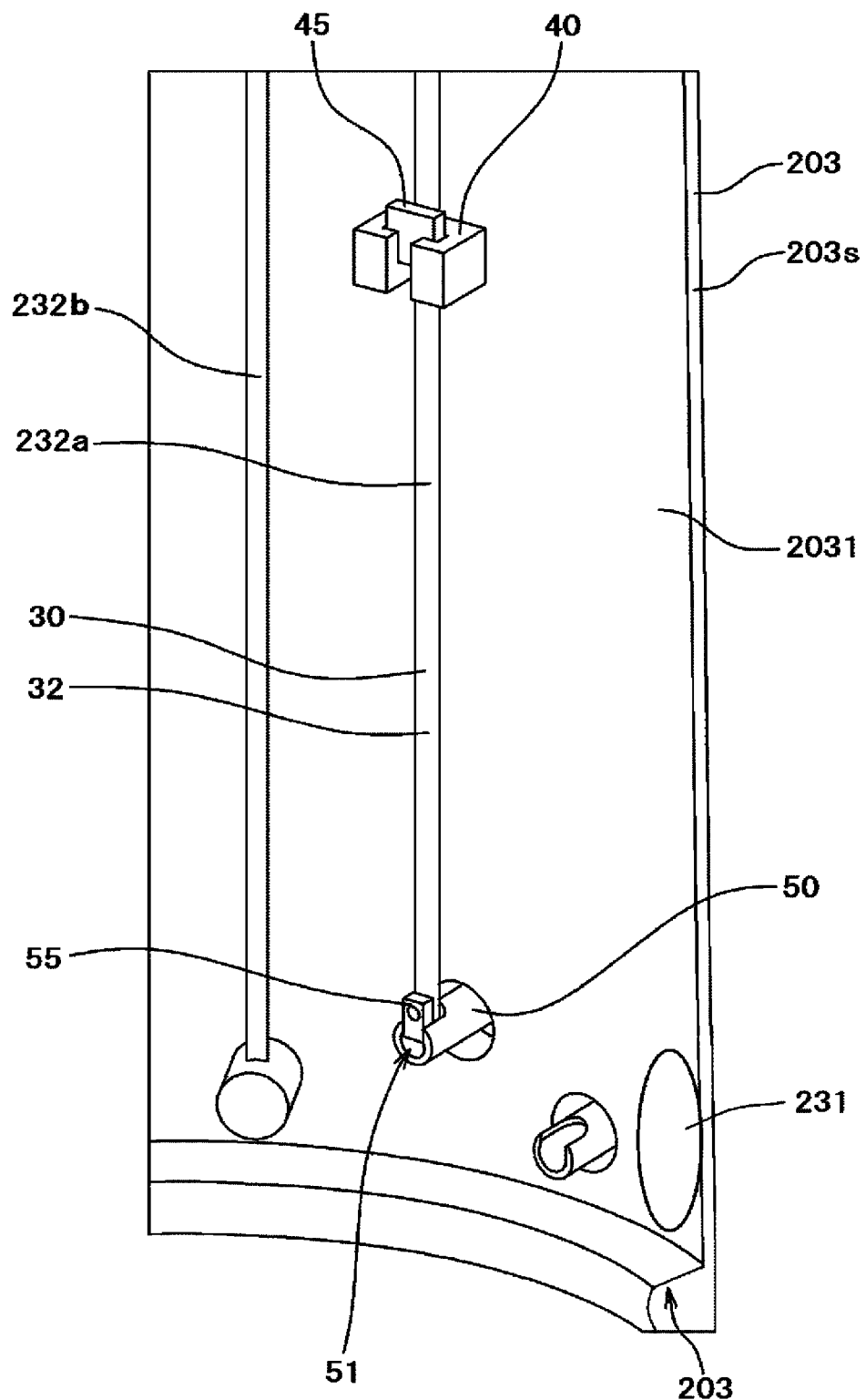
FIG. 3 is a diagram schematically illustrating a nozzle in the reaction tube of the substrate processing apparatus preferably used in the embodiments of the present disclosure.
Figure 4:
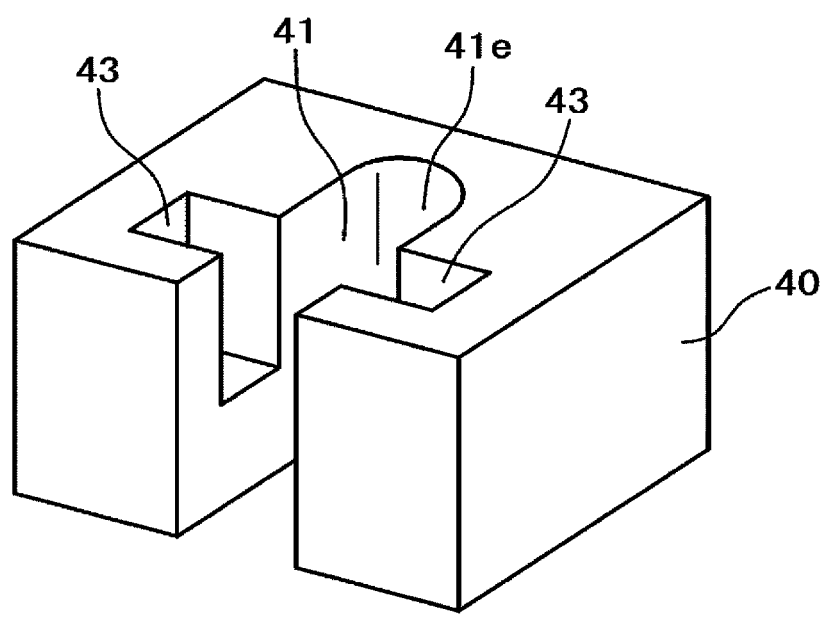
FIG. 4 is a diagram schematically illustrating a fixing block of the substrate processing apparatus preferably used in the embodiments of the present disclosure.
Figure 5:
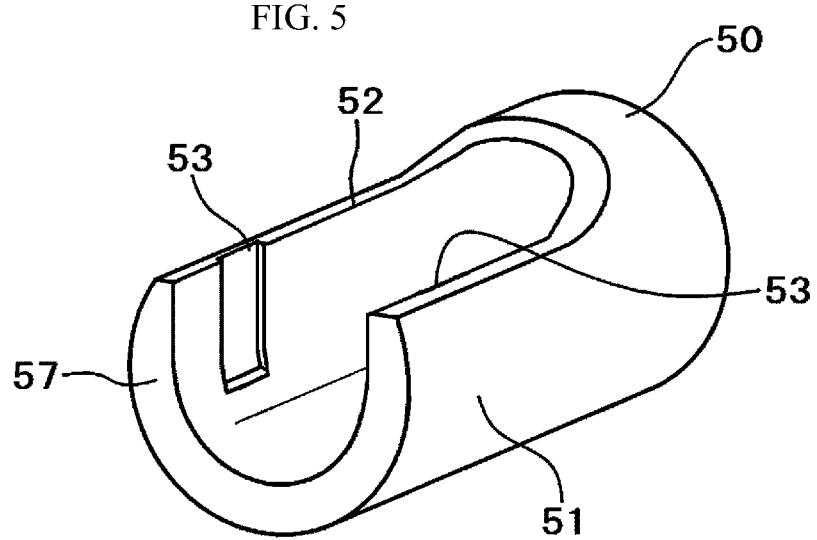
FIG. 5 is a diagram schematically illustrating a front end (tip) of a gas introduction structure of the substrate processing apparatus preferably used in the embodiments of the present disclosure.
Figure 6:
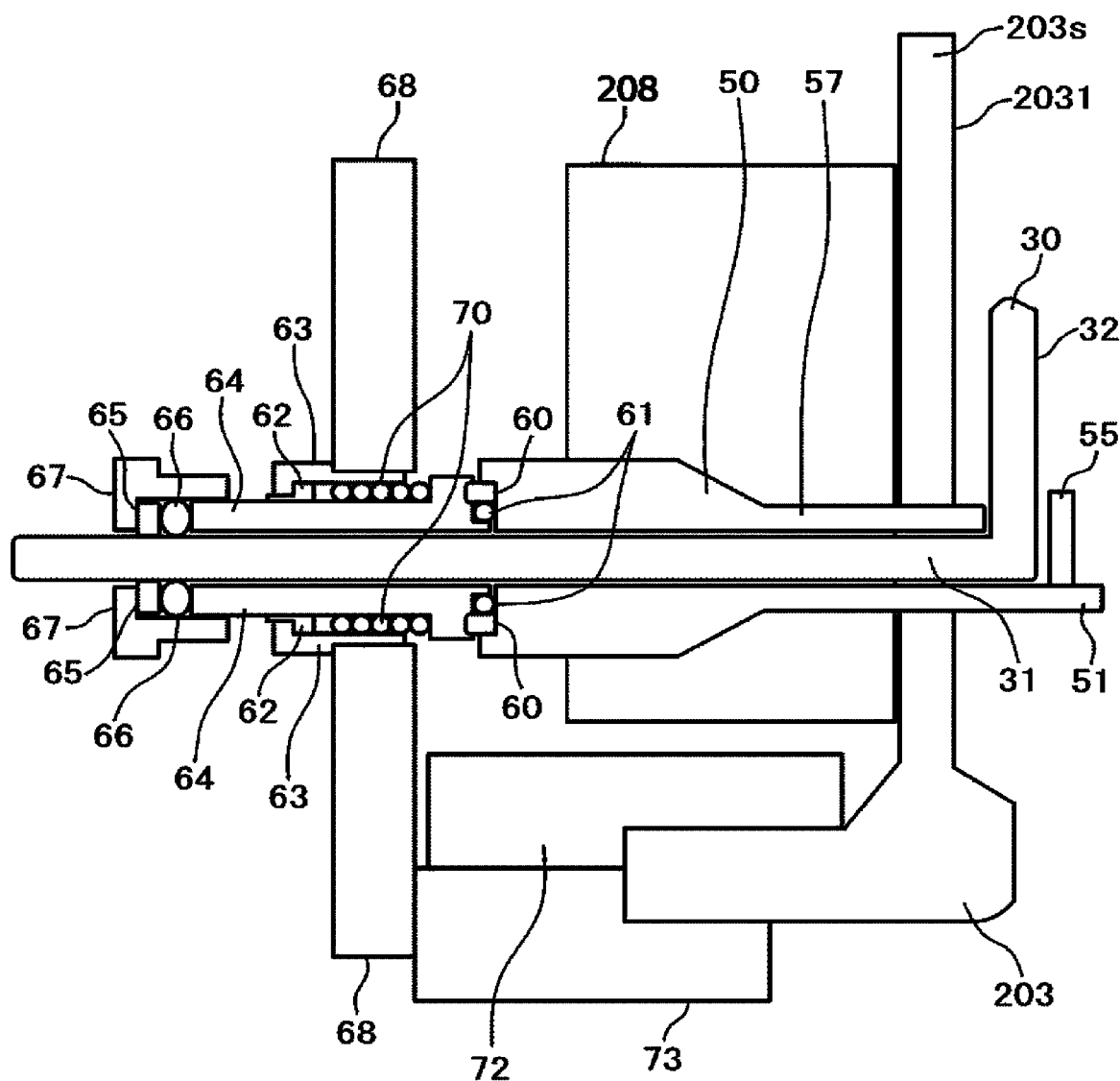
FIG. 6 is a diagram schematically illustrating a vertical cross-section of a configuration such as the gas introduction structure provided in the vicinity of the furnace opening of the reaction tube of the substrate processing apparatus preferably used in the embodiments of the present disclosure.

An exemplary configuration of installing the first gas supply pipe 232a and the second gas supply pipe 232b and an exemplary configuration of a gas introduction structure will be described with reference to FIGS. 3 through 6. FIG. 3 is a diagram schematically illustrating a nozzle in the reaction tube 203 of the substrate processing apparatus 1 preferably used in the embodiments of the present disclosure. FIG. 4 is a diagram schematically illustrating a fixing block of the substrate processing apparatus 1 preferably used in the embodiments of the present disclosure. FIG. 5 is a diagram schematically illustrating a front end (tip) of the gas introduction structure of the substrate processing apparatus 1 preferably used in the embodiments of the present disclosure. FIG. 6 is a diagram schematically illustrating a vertical cross-section of a configuration such as the gas introduction structure provided in the vicinity of the furnace opening of the reaction tube 203 of the substrate processing apparatus 1 preferably used in the embodiments of the present disclosure.

FIG. 3 is a perspective view of the inner wall 2031 of the reaction tube 203 when viewed from the inside of the reaction tube 203. The first gas supply pipe 232a and the second gas supply pipe 232b are attached to the inner wall 2031 of the reaction tube 203. The first gas supply pipe 232a is detachably attached to the inner wall 2031 of the reaction pipe 203. On the other hand, the second gas supply pipe 232b is undetachably attached to the inner wall 2031 of the reaction tube 203.

The first gas supply pipe 232a is configured as a replaceable nozzle 30. The nozzle 30 is inserted inside the gas introduction structure (which is a gas port) 50, and includes a first straight portion 31 (see FIG. 6) fluidically communicating with the gas introduction structure 50 and a second straight portion 32 fluidically communicating with the first straight portion 31 and provided along the inner wall 2031 of the reaction tube (hereinafter, also referred to as the "process vessel") 203. The first straight portion 31 and the second straight portion 32 are installed to form a substantially right angle by connecting the first straight portion 31 and the second straight portion 32. Thereby, an overall shape of the nozzle 30 is an L-shape.

An upper portion of the second straight portion 32 of the nozzle 30 is position-determined by the fixing block 40, and a lower portion of the second straight portion 32 is position-determined by a front end (tip) 51 serving as an end of the gas introduction structure 50. Thereby, it is possible to provide a configuration capable of connecting and fixing the nozzle 30 to the reaction tube 203 while preventing the nozzle 30 from collapsing or being detached from the reaction tube 203.

As shown in FIGS. 3 and 4, the fixing block 40 is provided at the inner wall 2031 inside the side wall 203s of the reaction tube 203, and is provided above the gas introduction structure 50.

The fixing block 40 is provided with a groove 41 in which the nozzle 30 is capable of being moved in a radial direction of the reaction tube 203 when viewed from above. For example, the fixing block 40 is integrated with the inner wall 2031 of the reaction tube 203 as a single structure by using a method such as welding, and the groove 41 is open toward an inner side of the reaction tube 203.

The groove 41 of the fixing block 40 is provided with a width expanding portion 43. A restriction plate 45 serving as a restrictor is fitted in the width expanding portion 43. The width expanding portion 43 is configured so as not to penetrate a lower end of the fixing block 40. The restriction plate 45 is made of a non-metallic material. For example, the restriction plate 45 is made of a heat resistant material such as quartz ($SiO_2$) and silicon carbide (SiC).

By inserting the restriction plate 45 into the width expanding portion 43 with the nozzle 30 arranged closer to a bottom of the groove 41 (that is, a portion of the groove 41 closer to the inner wall 2031) than the width expanding portion 43, it is possible to restrict a movement of the nozzle 30 (more specifically, the movement of the nozzle 30 in the radial direction of the reaction tube 203). That is, a horizontal position of the nozzle 30 (more specifically, the second straight portion 32) is determined in the horizontal direction by being interposed between an outer peripheral end 41e of the groove 41 of the fixing block 40 and the restriction plate 45.

The fixing block 40 is preferably provided at a position that can be reached when a worker puts his or her arm through the furnace opening of the reaction tube 203. Further, the fixing block 40 may be provided at a height within a heat insulating region of the reaction tube 203 (for example, a height of an upper end of the region B), a height (or a distance) of 40 cm or less from the furnace opening, or a height lower than a vertical center of the nozzle 30.

As shown in FIGS. 3 and 5, the gas introduction structure 50 penetrates the side wall 203s of the reaction tube 203, and is integrated with the side wall 203s of the reaction tube 203 as a single structure. The front end 51 of the gas introduction structure 50 protrudes into the reaction tube 203. The gas introduction structure 50 is made of a non-metallic material. For example, the gas introduction structure 50 is made of the same material as the reaction tube 203, that is, a heat resistant material such as quartz ($SiO_2$) and silicon carbide (SiC). The gas introduction structure 50 may be implemented as a double tube structure joined to each other at an outer end of the process vessel for the purpose of heat insulation or stress relief.

An end of the gas introduction structure 50 at the inner side of the reaction tube 203 (that is, the front end 51) extends further into the reaction tube 203 than the nozzle 30, and the front end 51 of the gas introduction structure 50 at the inner side of the reaction tube 203 is provided with a groove 53 into which a fastening plate 55 serving as a fastener is inserted. A horizontal position of a lower portion of the nozzle 30 (that is, the lower portion of the second straight portion 32) is determined by inserting the fastening plate 55 into the groove 53. In addition, by inserting the fastening plate 55 into the groove 53, it is possible to restrict the movement of the nozzle 30 (more specifically, the movement of the nozzle 30 in the radial direction of the reaction tube 203).

The gas introduction structure 50 is provided with an introduction tube 57 whose inner diameter substantially corresponds to an outer diameter of the nozzle 30. The introduction tube 57 corresponds to an inner tube of the double pipe structure described above. A notch 52 of a U-shape whose width substantially corresponds to the inner diameter of the introduction tube 57 is provided at a front end (that is, the front end 51) and an upper end of the introduction tube 57. The notch 52 opens an upper half of the front end (that is, the front end 51) of the introduction tube 57 to avoid interference with the second straight portion 32 of the nozzle 30.

A lower end of the nozzle 30 is of a shape corresponding to a surface of the gas introduction structure 50 facing the lower end of the nozzle 30, and is provided with an opening fluidically communicating between an inside of the nozzle 30 and the introduction tube 57. As described above, no metal structure is used in the reaction tube 203. Thereby, it is possible to prevent corrosion due to a contact with liquefied source materials and it is also possible to prevent a metal contamination in the reaction tube 203.

<Exemplary Configuration of Gas Introduction Structure>

An exemplary configuration of the gas introduction structure 50 will be described with reference to FIG. 6. FIG. 6 is a diagram schematically illustrating a vertical cross-section of a configuration such as the gas introduction structure 50 provided in the vicinity of the furnace opening of the reaction tube 203 of the substrate processing apparatus 1 preferably used in the embodiments of the present disclosure.

As shown in FIG. 6, the gas introduction structure 50 is provided on the side wall 203s of the reaction tube (process vessel) 203. The nozzle 30 is fixed to a mounting plate 68 by components such as a first buffer ring 60, a first seal ring 61, a washer 62, a union screw 63, a sleeve 64, a second buffer ring 65, a second seal ring 66, a cap nut 67 and a coil spring 70 while being inserted into the gas introduction structure 50. A cooling block 72 capable of cooling the furnace opening of the reaction tube 203 and a holder 73 capable of holding the furnace opening of the reaction tube 203 are provided at the furnace opening of the reaction tube 203.

For example, the sleeve 64 is of a cylindrical shape, and is made of a metal such as stainless steel (SUS) or a corrosion resistant material such as quartz ($SiO_2$). A groove into which the first buffer ring 60, the first seal ring 61 and the like are fitted is provided at a front end (tip) of one end of the sleeve 64 (that is, an end of the sleeve 64 facing the gas introduction structure 50), and a male thread is cut on an outer periphery of the other end of the sleeve 64 (that is, an end of the sleeve 64 facing the cap nut 67).

The union screw 63 is of a cylindrical shape, and is made of a metal such as stainless steel (SUS). A male screw is cut on an outer periphery of a right portion of the union screw 63, and is screwed into a screw hole (not shown) provided in the mounting plate 68 made of a metal such as stainless steel (SUS). An outer periphery of a left portion of the union screw 63 is of a hexagonal nut shape. By screwing the union screw 63 into the mounting plate 68, the coil spring 70 is urged, and a right end of the sleeve 64 is pressed against a left wall surface of the gas introduction structure 50 via the first seal ring 61.

The first seal ring (also simply referred to as an "O-ring") 61 is made of a fluororesin such as polytetrafluoroethylene (PTFE), and is of a ring shape. The first seal ring 61 is configured to seal a gap between the front end of the sleeve 64 (that is, a right end of the sleeve 64) and the front end of the gas introduction structure 50 (that is, the left wall surface of the gas introduction structure 50).

The second seal ring (also simply referred to as an "O-ring") 66 is made of a fluororesin such as polytetrafluoroethylene (PTFE), and is of a ring shape. The second seal ring 66 is configured to seal a gap between the other end of the sleeve 64 (that is, a left end of the sleeve 64) and an outer peripheral surface of the nozzle 30.

Each of the first buffer ring 60 and the second buffer ring 65 is made of a fluororesin such as polytetrafluoroethylene (PTFE), and is used to prevent excessive deformation of the seal rings 61 and 66.

The washer 62 is made of a metal such as stainless steel (SUS), and is provided between the union screw 63 and the sleeve 64 and between the coil spring 70 and the union screw 63. The washer 62 is used to reduce friction.

The cap nut 67 is made of a metal such as stainless steel (SUS), is screwed on the outer periphery of the left end of the sleeve 64, sandwiches the second seal ring 66 between the sleeve 64 and the cap nut 67. With the second seal ring 66 inserted between the sleeve 64 and the cap nut 67, the cap nut 67 is used to press the second seal ring 66 against the sleeve 64 and the nozzle 30.

Thus, the nozzle 30 is supported by the sleeve 64 that is not rigidly joined to the mounting plate 68. Therefore, even when an assembly dimensional tolerance between the gas introduction structure 50 and the mounting plate 68 is large, it is possible to install the nozzle 30 without being damaged, and it is also possible to slightly adjust an angle of the nozzle 30.

The nozzle 30 may be attached to the reaction tube (process vessel) 203 by performing the following steps.

1) An Insertion Step of the Nozzle 30

The worker inserts the nozzle 30 into the reaction tube 203 through the furnace opening provided at a lower portion of the reaction tube 203. Then, when inserting the first straight portion 31 of the nozzle 30 into the gas introduction structure 50, the second straight portion 32 of the nozzle 30 is inserted into the groove 41 until the second straight portion 32 of the nozzle 30 comes into contact with the bottom portion of the groove 41 of the fixing block 40 (that is, the outer peripheral end 41e of the groove 41 of the fixing block 40). In such a state, the worker can take his or her hand off the nozzle 30 without detaching, tilting or damaging the nozzle 30.

2) An Installation Step of the Restriction Plate 45 and the Fastening Plate 55

Then, the worker puts his or her hand inward through the furnace opening of the reaction tube 203, inserts the restriction plate 45 into the width expanding portion 43, and inserts the fastening plate 55 into the groove 53.

3) An Installation Step of the Nozzle 30 to the Gas Introduction Structure 50

The worker properly tightens the union screw 63 and the cap nut 67 such that the nozzle 30 is airtightly installed to the gas introduction structure 50.

When removing the nozzle 30 from the reaction tube 203, it is possible to remove the nozzle 30 from the reaction tube 203 by performing the step 1), the step 2) and the step 3) described above in an order reverse to that of attaching the nozzle 30 to the reaction tube 203. That is, the union screw 63 and the cap nut 67 are loosened, then the restriction plate 45 and the fastening plate 55 are removed, and then the first straight portion 31 of the nozzle 30 is pulled out from the gas introduction structure 50. Then, the nozzle 30 is taken out from the furnace opening of the reaction tube 203 to the outside of the reaction tube 203.

By attaching the nozzle 30 to the reaction tube 203 as described above, it is possible to connect and fix the nozzle 30 made of quartz to the reaction tube 203 made of quartz while preventing the nozzle 30 constituting the first gas supply pipe 232a from collapsing in the reaction tube 203. Further, it is also possible to evaluate various nozzles by replacing the nozzle 30 in the reaction tube 203 with another nozzle.

<Controller>

Figure 7:
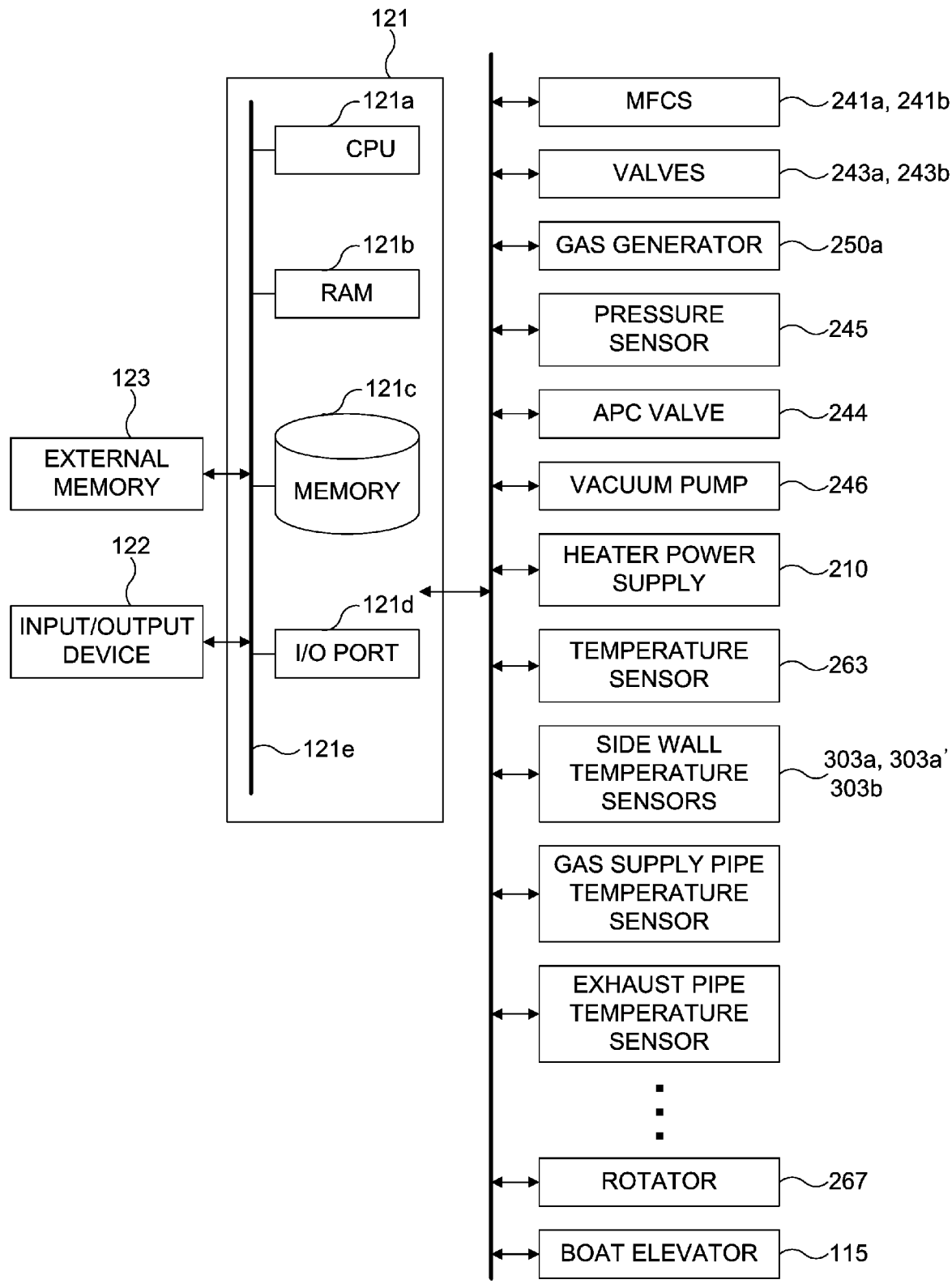
FIG. 7 is a block diagram schematically illustrating a configuration of a controller and related components of the substrate processing apparatus preferably used in the embodiments of the present disclosure.

Subsequently, a controller 121 configured to control operations of components constituting the substrate processing apparatus 1 will be described with reference to FIG. 7. FIG. 7 is a block diagram schematically illustrating a configuration of the controller 121 and related components of the substrate processing apparatus 1 preferably used in the embodiments of the present disclosure.

As shown in FIG. 7, the substrate processing apparatus 1 includes the controller 121 configured to control the operations of the components constituting the substrate processing apparatus 1. For example, the controller 121 serving as a control structure is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus 121e. For example, an input/output device 122 constituted by a component such as a touch panel is connected to the controller 121.

For example, the memory 121c is configured by a component such as a flash memory and a hard disk drive (HDD). For example, a control program configured to control the operations of the substrate processing apparatus 1 or a process recipe containing information on sequences and conditions of the substrate processing described later may be readably stored in the memory 121c. The process recipe is obtained by combining steps (sequences) of the substrate processing described later such that the controller 121 can execute the steps to acquire a predetermined result, and functions as a program. Hereinafter, the process recipe and the control program may be collectively or individually referred to as a "program". In addition, the process recipe may also be simply referred to as a "recipe". Thus, in the present specification, the term "program" may refer to the recipe alone, may refer to the control program alone, or may refer to both of the recipe and the control program. The RAM 121b functions as a memory area where a program or data read by the CPU 121a is temporarily stored.

The I/O port 121d is connected to the above-described components such as the MFCs 241a and 241b, the valves 243a and 243b, the gas generator 250a, the pressure sensor 245, the APC valve 244, the vacuum pump 246, the heater power supply 210, the temperature sensor 263, the side wall temperature sensors 303a, 303a' and 303b, a gas supply pipe temperature sensor (not shown), an exhaust pipe temperature sensor (not shown), the rotator 267 and the boat elevator 115. The gas supply pipe temperature sensor is a pipe temperature sensor configured to measure a temperature of each of the gas supply pipes 232a and 232b. The exhaust pipe temperature sensor is a pipe temperature sensor configured to measure a temperature of the exhaust pipe 231.

The CPU 121a is configured to read the control program from the memory 121c and execute the read control program. In addition, the CPU 121a is configured to read the recipe from the memory 121c in accordance with an operation command inputted from the input/output device 122. In accordance with the contents of the read recipe, the CPU 121a may be configured to be capable of controlling various operations such as a gas generating operation of the gas generator 250a, flow rate adjusting operations for various gases by the MFCs 241a and 241b, opening/closing operations of the valves 243a and 243b, a pressure adjusting operation by the APC valve 244 based on the pressure sensor 245, a start and stop of the vacuum pump 246, an adjusting operation of an amount of the electric power supplied from the heater power supply 210 to the heaters 207 and 208 and a cap heater (not shown) based on the temperature sensor 263, the side wall temperature sensors 303a, 303a' and 303b, the gas supply pipe temperature sensor and exhaust pipe temperature sensor, an operation of adjusting the rotation and the rotation speed of the boat 217 by the rotator 267 and an elevating and lowering operation of the boat 217 by the boat elevator 115. The cap heater is provided under the seal cap 219, and is a heating structure used for heating the seal cap 219.

The controller 121 may be embodied by installing the above-described program stored in an external memory 123 into the computer. For example, the external memory 123 may include a magnetic disk such as a hard disk drive (HDD), an optical disk such as a CD, a magneto-optical disk such as an MO and a semiconductor memory such as a USB memory. The memory 121c or the external memory 123 may be embodied by a non-transitory computer readable recording medium. Hereafter, the memory 121c and the external memory 123 may be collectively or individually referred to as a "recording medium". In the present specification, the term "recording medium" may refer to the memory 121c alone, may refer to the external memory 123 alone, or may refer to both of the memory 121c and the external memory 123. In addition, instead of the external memory 123, a communication structure such as the Internet and a dedicated line may be used for providing the program to the computer.

(2) Substrate Processing

Figure 8:
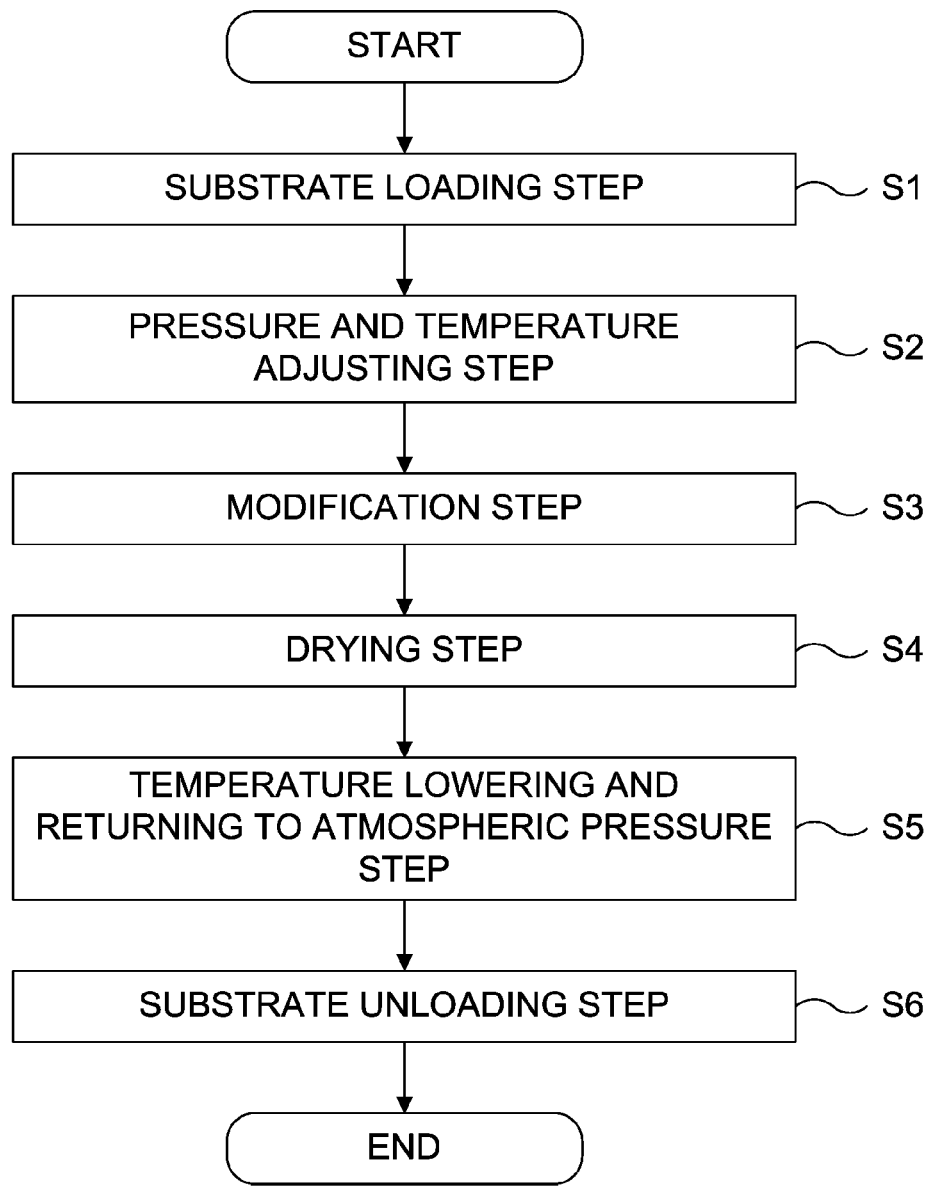
FIG. 8 is a flow chart schematically illustrating an exemplary sequence of a substrate processing preferably used in the embodiments of the present disclosure.

Subsequently, an example of the substrate processing performed as a part of a manufacturing process of a semiconductor device by using the substrate processing apparatus 1 will be described with reference to FIG. 8. FIG. 8 is a flow chart schematically illustrating an exemplary sequence of the substrate processing preferably used in the embodiments of the present disclosure. In the following descriptions, the operations of the components constituting the substrate processing apparatus 1 are controlled by the controller 121.

For example, a film containing a silazane bond (—Si—N—) or a siloxane bond (—O—Si—O—) (that is, a polysilazane film or a siloxane polymer) is formed on a surface of the substrate (that is, the wafer 200) to be subject to a predetermined process in the substrate processing. The film such as the polysilazane film and a siloxane polymer may often be formed by using a coating method, and may also be referred to as a "SOD" (spin-on dielectric) or "SOG" (Spin-on Glass). For example, the polysilazane film contains nitrogen (N) and hydrogen (H) in addition to silicon (Si). The polysilazane film may further contain carbon (C) and other impurities in some cases. According to the substrate processing, by supplying the vaporized gas of the first oxidizing agent to the polysilazane film formed on the wafer 200 under a relatively low temperature condition, it is possible to modify (or oxidize) the polysilazane film.

<Substrate Loading Step S1>

The wafers 200 with the polysilazane film formed on the surfaces thereof are loaded (charged) into the boat 217. After the boat 217 is charged with the wafers 200, the boat 217 accommodating the wafers 200 is elevated by the boat elevator 115 and loaded into the process chamber 201 as shown in FIG. 1. With the boat 217 loaded, the seal cap 219 seals the lower end opening of the reaction tube 203 via an O-ring.

<Pressure and Temperature Adjusting Step S2>

The vacuum pump 246 vacuum-exhausts the inner atmosphere of the process chamber 201 (that is, a space in which the wafers 200 are accommodated) until the inner pressure of the process chamber 201 reaches and is maintained at a predetermined pressure (modification pressure). Further, the reaction tube 203, the wafers 200 accommodated in the process chamber 201, the seal cap 219 and the like are heated by the heaters 207 and 208 and the cap heater (not shown).

When heating the reaction tube 203, the wafers 200 accommodated in the process chamber 201, the seal cap 219 and the like, a state of electric conduction from the heater power supply 210 to the heater 207 is feedback-controlled based on the temperature information detected by the temperature sensor 263 such that a temperature of the wafer 200 accommodated in the region A reaches and is maintained at a predetermined temperature.

Further, the state of electric conduction from the heater power supply 210 to the heater 208 is feedback-controlled based on the temperature information detected by the temperature sensors (that is, the side wall temperature sensors 303a and 303b, the gas supply pipe temperature sensor, the exhaust pipe temperature sensor) provided at the heater 208 such that a temperature of the side wall of the furnace opening of the reaction tube 203, a temperature of the first gas supply pipe 232a, a temperature of the temperature sensor protection pipe 263a and a temperature of the exhaust pipe 231 reach and are maintained at predetermined temperatures, respectively, or such that predetermined temperature distributions can be obtained with respect to the temperatures described above, respectively.

The state of electric conduction from the heater power supply 210 to each of the heaters 207 and 208 are continuously feedback-controlled until at least a processing of the wafer 200 is completed. Further, the rotator 267 starts to rotate the wafer 200. Until at least the processing of the wafer 200 is completed, the vacuum pump 246 continuously vacuum-exhausts the inner atmosphere of the process chamber 201, the heater 207 continuously heats the wafer 200 and the rotator 267 continuously rotates the wafer 200.

<Modification Step S3>

Subsequently, a supply of the source material in the liquid state (that is, the first oxidizing agent) and a supply of the carrier gas to the gas generator 250a are started, and the vaporized gas of the first oxidizing agent is generated by the gas generator 250a. After an amount and a concentration of the vaporized gas are stabilized, the valves 243a and 243b are opened, and the vaporized gas and the second oxidizing agent are supplied into the process chamber 201 through the gas supply holes of the gas supply pipes 232a and 232b while controlling flow rates of the vaporized gas and the second oxidizing agent by the MFCs 241a and 241b, respectively. The vaporized gas and the second oxidizing agent supplied into the process chamber 201 are exhausted through the exhaust pipe 231. When supplying the vaporized gas and the second oxidizing agent, an oxidation reaction occurs on the surface of the wafer 200. Thereby, the polysilazane film on the wafer 200 is modified into a silicon oxide film (also referred to as a "SiO film").

After a predetermined time has elapsed and the polysilazane film is completely modified into the SiO film, the valve 243a is closed to stop the supply of the vaporized gas into the process chamber 201.

For example, process conditions of the modification step S3 are as follows.

The concentration of the first oxidizing agent serving as the source material in the liquid state: from 20% to 40%, preferably from 25% to 35%;

Vaporization conditions for the source material in the liquid state: heated to 120° C. to 200° C. under approximately atmospheric pressure;

The modification pressure: from 700 hPa to 1,000 hPa (one among the atmospheric pressure, a slightly decompressed pressure or a slightly compressed pressure); and The temperature of the wafer 200: from 70° C. to 110° C., preferably from 70° C. to 80° C.

Under the temperature conditions described above, the vaporized gas supplied into the process chamber 201 may be re-liquefied in the process chamber 201, and the liquid generated by the re-liquefaction of the vaporized gas may be stagnant around the furnace opening such as the upper surface of the seal cap 219. In particular, a local low temperature region as described above may occur in components such as the side wall of the furnace opening, the first gas supply pipe 232a in the process chamber 201 and the temperature sensor protection pipe 263a, and the vaporized gas may be easily re-liquefied by contacting the local low temperature region.

According to the present embodiments, by controlling the heater 208 configured as described above, it is possible to uniformly heat the components such as the side wall of the furnace opening of the reaction tube 203, and it is also possible to prevent the local low temperature region from occurring. According to the present embodiments, in order to prevent the re-liquefaction of the vaporized gas, a temperature control is performed so that there exists no region whose temperature is lower than a predetermined temperature (first lower limit temperature) on the components such as the side wall around the furnace opening of the reaction tube 203. The first lower limit temperature may vary depending on conditions such as the concentration of the vaporized gas, but may be set to, for example, 80° C. or higher under the process conditions described above.

<Drying Step S4>

When the modification step S3 is completed, the heater 207 is controlled to heat the wafer 200 to a temperature higher than the modification temperature described above. By maintaining the temperature higher than the modification temperature, it is possible to gently dry the wafer 200 and an inside of the process chamber 201.

<Temperature Lowering and Returning to Atmospheric Pressure Step S5>

After the drying step S4 is completed, the inside of the process chamber 201 is vacuum-exhausted. Thereafter, the inner pressure of the process chamber 201 is returned to the atmospheric pressure. After a predetermined time has elapsed, the inner temperature of the process chamber 201 is lowered to a predetermined temperature at which the wafer 200 can be unloaded.

<Substrate Unloading Step S6>

The seal cap 219 is lowered by the boat elevator 115, and the lower end opening of the reaction tube 203 is opened. Then, the boat 217 accommodating the wafers 200 processed according to the steps described above is unloaded (transferred) out of the reaction tube 203 through the lower end opening of the reaction tube 203. Thereafter, the wafers 200 processed according to the steps described above are unloaded (discharged) out of the boat 217.

Other Embodiments

While the technique of the present disclosure is described in detail by way of the embodiments described above, the technique of the present disclosure is not limited thereto.

The technique of the present disclosure may be modified in various ways without departing from the scope thereof.

According to some embodiments of the present disclosure, it is possible to connect and fix the nozzle to the reaction tube while preventing the nozzle from collapsing.

The invention claimed is:

1. A substrate processing apparatus comprising:
    a gas introduction structure made of a non-metallic material, penetrating a side wall of a process vessel and integrated with the side wall as a single structure, wherein a front end thereof protrudes into the process vessel;
    a nozzle made of a non-metallic material and comprising:
        a first straight portion inserted into the gas introduction structure and fluidically communicating with the gas introduction structure; and
        a second straight portion fluidically communicating with the first straight portion and extending along an inner wall of the process vessel; and
    a fixing block provided at an inner side of the side wall of the process vessel and above the gas introduction structure, wherein the fixing block is provided with a groove in which the nozzle is capable of being moved in a radial direction of the process vessel.

2. The substrate processing apparatus of claim 1, wherein an end of the gas introduction structure at an inner side of the process vessel extends further into the process vessel than the nozzle, and a fastener is inserted into the end of the gas introduction structure at the inner side of the process vessel.

3. The substrate processing apparatus of claim 1, wherein the fixing block is integrally formed with the process vessel as a single structure, and the groove is open toward an inner side of the process vessel.

4. The substrate processing apparatus of claim 3, further comprising a restrictor made of a non-metallic material and configured to restrict a movement of the nozzle,
    wherein the groove is provided with a width expanding portion, and the restrictor is fitted in the width expanding portion with the nozzle arranged on a bottom portion of the groove located closer to a bottom of the groove than the width expanding portion.

5. The substrate processing apparatus of claim 1, wherein the fixing block is provided at a height within a heat insulating region of the process vessel or a height lower than a vertical center of the nozzle.

6. The substrate processing apparatus of claim 5, wherein the fixing block is provided at a distance of 40 cm or less from a furnace opening of the process vessel.

7. The substrate processing apparatus of claim 4, wherein the width expanding portion is configured so as not to penetrate a lower end of the fixing block.

8. The substrate processing apparatus of claim 4, wherein a horizontal position of the nozzle is determined by being interposed between an outer peripheral end of the groove and the restrictor.

9. The substrate processing apparatus of claim 2, wherein the gas introduction structure is provided with an introduction tube whose inner diameter substantially corresponds to an outer diameter of the nozzle, and a notch of a U-shape whose width substantially corresponds to the inner diameter of the introduction tube is provided at a front end and an upper end of the introduction tube.

10. The substrate processing apparatus of claim 9, wherein a lower end of the nozzle is of a shape corresponding to a surface of the gas introduction structure facing the lower end of the nozzle, and is provided with an opening fluidically communicating between an inside of the nozzle and the introduction tube.

11. The substrate processing apparatus of claim 2, wherein a lower end of the nozzle is of a shape corresponding to a surface of the gas introduction structure facing the lower end of the nozzle, and is provided with an opening fluidically communicating between an inside of the nozzle and the gas introduction structure.

12. The substrate processing apparatus of claim 1, wherein the nozzle is provided with a discharge hole through which at least one selected from the group consisting of vaporized hydrogen peroxide, water and ozone is supplied into the process vessel.

13. The substrate processing apparatus of claim 1, wherein the nozzle is supported by a sleeve that is not rigidly joined to a mounting plate.

14. A process vessel comprising:
a side wall;
a gas introduction structure made of a non-metallic material, penetrating the side wall and integrated with the side wall as a single structure, wherein a front end thereof protrudes into the process vessel; and
a fixing block provided at an inner side of the side wall and above the gas introduction structure, wherein the fixing block is provided with a groove in which a nozzle is capable of being moved in a radial direction of the process vessel,
wherein, when the nozzle comprising a first straight portion and a second straight portion bending and extending from the first straight portion is inserted through the gas introduction structure, the fixing block is configured to be capable of supporting the second straight portion.

15. A method of manufacturing a semiconductor device, comprising:
(a) loading a substrate into a process vessel of a substrate processing apparatus; and
(b) processing the substrate,
wherein the substrate processing apparatus comprises:
a gas introduction structure made of a non-metallic material, penetrating a side wall of a process vessel, and integrated with the side wall of the process vessel as a single structure, wherein a front end thereof protrudes into the process vessel;
a nozzle made of a non-metallic material and comprising:
a first straight portion inserted into the gas introduction structure and fluidically communicating with the gas introduction structure; and
a second straight portion fluidically communicating with the first straight portion and extending along an inner wall of the process vessel; and
a fixing block provided at an inner side of the side wall of the process vessel and above the gas introduction structure, wherein the fixing block is provided with a groove in which the nozzle is capable of being moved in a radial direction of the process vessel.

16. A non-transitory tangible medium storing a program that causes, by a computer, a substrate processing apparatus to perform the method of manufacturing a semiconductor device of claim 15.

* * * * *